(12) United States Patent
Liu

(10) Patent No.: US 10,923,839 B2
(45) Date of Patent: Feb. 16, 2021

(54) LINKING BOARD DISPLACEMENT MECHANISM AND ELECTRONIC APPARATUS

(71) Applicant: Wistron Corporation, New Taipei (TW)

(72) Inventor: Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 70 days.

(21) Appl. No.: 15/979,482

(22) Filed: May 15, 2018

(65) Prior Publication Data

US 2019/0280407 A1 Sep. 12, 2019

(30) Foreign Application Priority Data

Mar. 12, 2018 (TW) .............................. 107108343 A

(51) Int. Cl.
*H01R 12/70* (2011.01)
*B66F 7/06* (2006.01)
*H05K 5/02* (2006.01)

(52) U.S. Cl.
CPC ..... *H01R 12/7011* (2013.01); *H01R 12/7076* (2013.01); *H05K 5/0226* (2013.01); *B66F 7/065* (2013.01)

(58) Field of Classification Search
CPC ...... B66F 3/00; B66F 3/22; B66F 7/00; B66F 7/06; B66F 7/065; B66F 7/0658; B66F 7/0666; B66F 7/0683; B66F 11/042; H05K 7/1492; H05K 5/0247; H05K 5/0266; H05K 5/0269; H05K 5/0282; H05K 5/0286;

(Continued)

(56) References Cited

U.S. PATENT DOCUMENTS 3,490,603 A * 1/1970 Willer .................. H05K 7/1417
　　　　　　　　　　　　　　　　　　　211/41.17
3,759,475 A * 9/1973 Brown ................. H05K 7/1421
　　　　　　　　　　　　　　　　　　　248/277.1

(Continued)

FOREIGN PATENT DOCUMENTS

CN　　　2684406　　　3/2005
CN　　202053059　　11/2011

(Continued)

OTHER PUBLICATIONS

"Office Action of Taiwan Counterpart Application", dated Dec. 6, 2018, p. 1-p. 8.

(Continued)

*Primary Examiner* — Orlando E Aviles
*Assistant Examiner* — Robert F Neibaur
(74) *Attorney, Agent, or Firm* — JCIPRNET

(57) ABSTRACT

A linking board displacement mechanism is adapted to carry a linking board. The linking board displacement mechanism includes a base and two linkage bars. The linking board is disposed on the base. The two linkage bars are connected together in a cross configuration and are respectively hinged at the base. The linkage bars drive the base to move along a first axis stably. A first connector of the linking board is aligned with a second connector of an electronic device along the first axis. An electronic apparatus including the linking board displacement mechanism is also provided.

8 Claims, 7 Drawing Sheets

(58) Field of Classification Search
CPC ...... H05K 7/14; H05K 7/1417; H05K 7/1422; H05K 7/1454; G06F 1/1615; G06F 1/1616; G06F 1/1681; H04M 1/0237; Y10T 16/209; H01R 12/7011; H01R 12/7076
USPC ................ 254/124, 122, 120, 113, 119, 126; 25/124, 122, 120, 113, 119, 126
See application file for complete search history.

(56) References Cited

U.S. PATENT DOCUMENTS

| | | | | |
|---|---|---|---|---|
| 5,131,501 | A * | 7/1992 | Yoshikawa | ........... B62B 3/0625 187/244 |
| 5,193,649 | A * | 3/1993 | Lee | ....................... B66F 7/0625 182/141 |
| 8,500,098 | B2 * | 8/2013 | Li | ............................ B66F 7/14 254/100 |
| 9,463,966 | B1 * | 10/2016 | Damabi | .................... B66F 3/22 |
| 2013/0163198 | A1 * | 6/2013 | Li | ........................ H05K 7/1492 361/679.58 |
| 2018/0160572 | A1 * | 6/2018 | Elias | ....................... B60L 53/38 |
| 2018/0172204 | A1 * | 6/2018 | Grappe | .................... A47C 4/28 |

FOREIGN PATENT DOCUMENTS

| | | | | |
|---|---|---|---|---|
| CN | 103915736 | | 7/2014 | |
| EP | 2719653 | A1 * | 4/2014 | ............ B66F 7/0691 |
| TW | M344548 | | 11/2008 | |
| TW | 201118538 | | 6/2011 | |
| TW | 201328543 | | 7/2013 | |
| WO | WO-2014092331 | A1 * | 6/2014 | ................ B66F 3/22 |

OTHER PUBLICATIONS

"Office Action of China Counterpart Application", dated Apr. 17, 2020, p. 1-p. 11.
"Office Action of China Counterpart Application", dated Nov. 17, 2020, with brief English summary thereof, p. 1-p. 12.

* cited by examiner

LINKING BOARD DISPLACEMENT MECHANISM AND ELECTRONIC APPARATUS

CROSS-REFERENCE TO RELATED APPLICATION

This application claims the priority benefit of Taiwan application serial no. 107108343, filed on Mar. 12, 2018. The entirety of the above-mentioned patent application is hereby incorporated by reference herein and made a part of this specification.

BACKGROUND

Technical Field

The disclosure relates to a displacement mechanism and an electronic apparatus, and in particular, to a linking board displacement mechanism and an electronic apparatus.

Description of Related Art

In response to the development of information technologies and the demand for storing and computing data, various data storage and computation centers are established in large numbers. A plurality of electronic devices (e.g., servers and computation modules) are generally installed into the same cabinet (e.g., a server cabinet) to form an electronic apparatus (e.g., a server system) to save space and enable the plurality of electronic devices to operate in coordination. However, when plugging and unplugging the electronic devices in the cabinet, if a great alignment tolerance is present between a connector of a linking board in the cabinet and a connector of the electronic device, it is likely that the two cannot be joined together, or that the connector of the electronic device and the connector of the linking board may be connected in a non-parallel manner, which results in damage.

SUMMARY

The embodiments of the invention provide a linking board displacement mechanism that moves a linking board fixed on it to reduce an alignment tolerance between a connector of an electronic device and a connector of the linking board and limit unexpected movement of the connectors, which prevents a non-parallel configuration of the linking board and thereby reduces a possibility of damage resulting from bump when the connector of the linking board and the connector of the electronic device are joined together.

The embodiments of the invention provide an electronic apparatus that provides an electronic device and a linking board having excellent contact with each other, which enhances performance of the electronic apparatus and reduces damage to the electronic device.

A linking board displacement mechanism adapted to carry a linking board includes a base and two linkage bars. The linking board is disposed on the base. The two linkage bars are connected together in a cross configuration and are respectively hinged at the base. The linkage bars drive the base to be moved along a first axis such that a first connector of the linking board is aligned with a second connector of an electronic device on the first axis.

In an embodiment of the invention, the linking board displacement mechanism further includes a pivot. Each of the linkage bars forms a second elliptical slot. The pivot passes through and hinges the second elliptical slots.

In an embodiment of the invention, the linking board displacement mechanism further includes a pivot. The linkage bars respectively form a second elliptical slot and a second through-hole. The second elliptical slot and the second through-hole are partially overlapped with each other. The pivot passes through and hinges the second elliptical slot and the second through-hole.

An electronic apparatus according to an embodiment of the invention is adapted to be joined with an electronic device. The electronic apparatus includes a chassis and a linking board displacement mechanism. The linking board displacement mechanism is disposed in the chassis and is adapted to carry a linking board. The linking board displacement mechanism includes a base and two linkage bars. The linking board is disposed on the base. The two linkage bars are connected together in a cross configuration and are respectively hinged at the base. The linkage bars drive the base to be moved along a first axis such that a first connector of the linking board is aligned with a second connector of the electronic device on the first axis.

In an embodiment of the invention, the linking board displacement mechanism further includes a pivot. Each of the linkage bars forms a second elliptical slot. The pivot passes through and hinges the second elliptical slots.

In an embodiment of the invention, the linking board displacement mechanism further includes a pivot. The linkage bars respectively form a second elliptical slot and a second through-hole. The second elliptical slot and the second through-hole are partially overlapped with each other. The pivot passes through and hinges the second elliptical slot and the second through-hole.

Accordingly, the electronic apparatus of the invention includes the linking board displacement mechanism and is adapted to be joined with the electronic device. The linking board displacement mechanism includes the two linkage bars connected together in a cross configuration. The first ends of the linkage bars are hinged at the base, and the opposite second ends are hinged at the chassis. Therefore, when the linking board is fixed to the base and an alignment error is present in the chassis between the second connector of the electronic device and the first connector of the linking board on the first axis, in the process where the second connector of the electronic device and the first connector of the linking board are joined together, the base of the linking board displacement mechanism may be guided by the electronic device to be moved along the first axis by the linkage bars. Accordingly, the second connector can be aligned with the first connector to compensate for the alignment tolerance between the first connector and the second connector. Moreover, the linking board is fixed on the base to be moved by translation along the first axis. Therefore, a non-parallel configuration of the linking board can be prevented, and undesirable non-parallel joining can be reduced. A possibility of damage resulting from bump when the connector of the linking board and the connector of the electronic device are joined together may be further reduced, and the issue of loose contact between the electronic device and the linking board may be solved. Moreover, the linking board displacement mechanism provides excellent contact between the electronic device and the linking board in the chassis and thereby enhances performance of the electronic apparatus.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
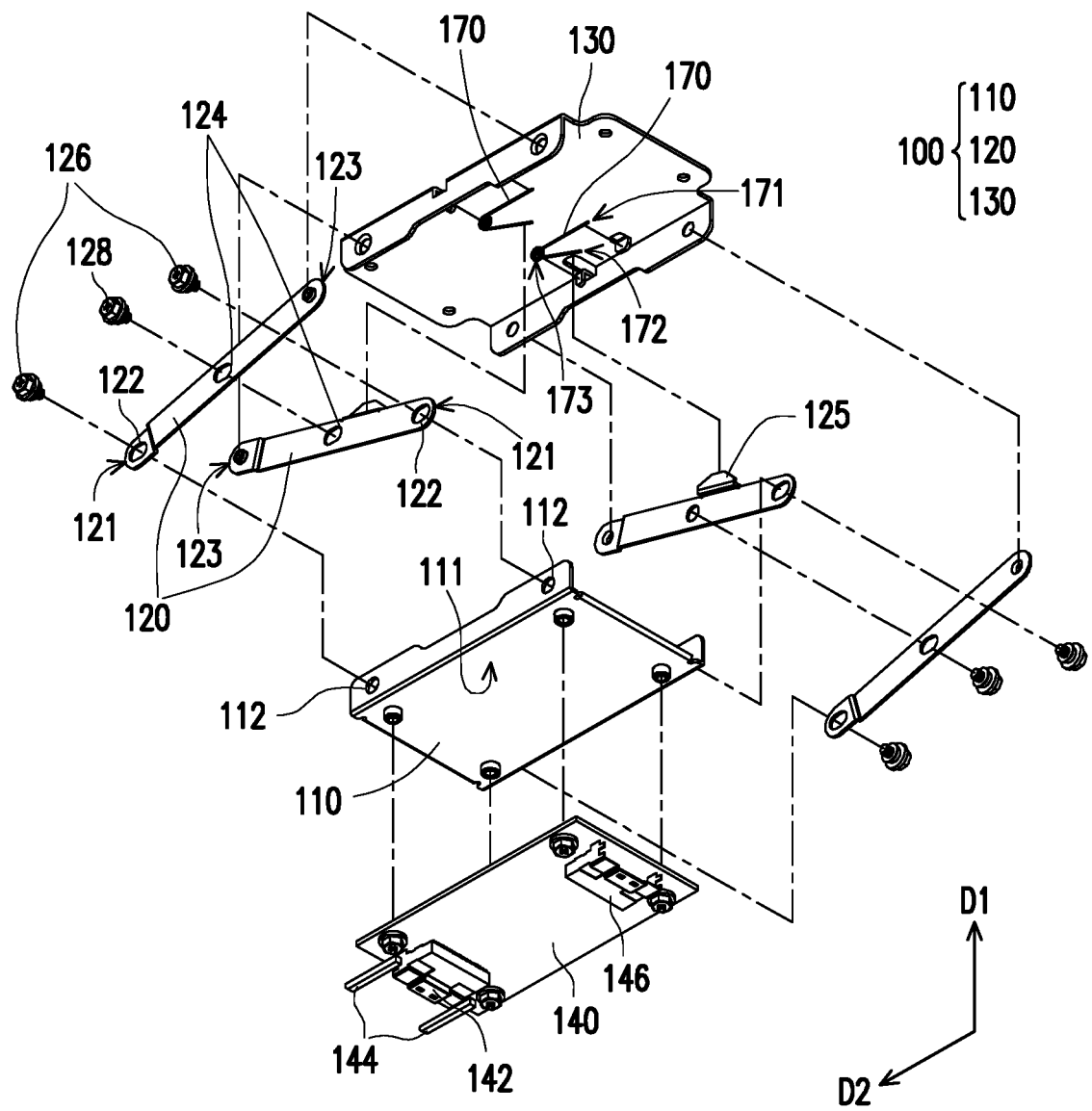
FIG. 1 is an exploded schematic diagram illustrating a linking board displacement mechanism adapted to carry a linking board according to an embodiment of the invention.
Figure 2:
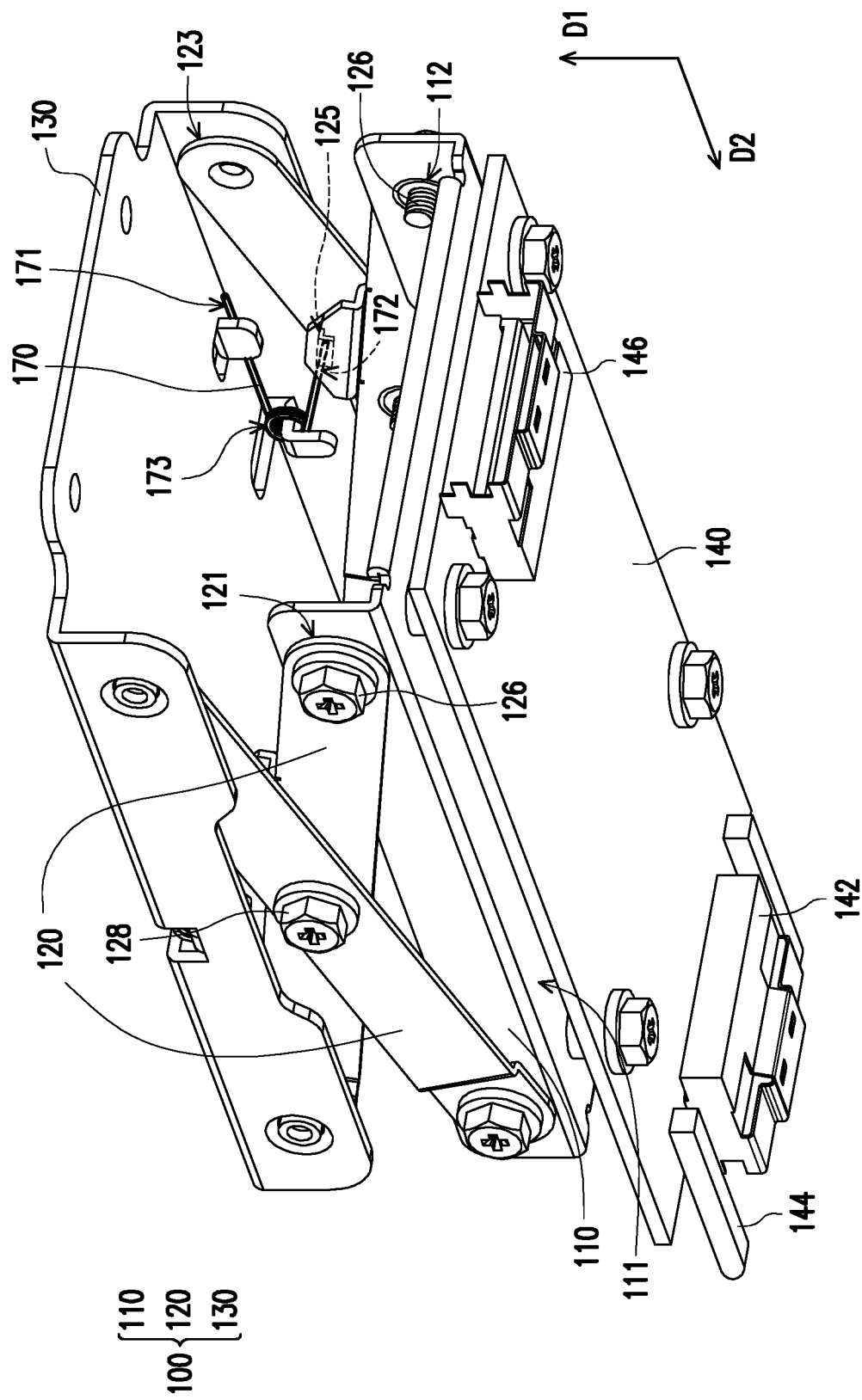
FIG. 2 is a perspective schematic diagram illustrating the linking board displacement mechanism of FIG. 1.

FIG. 1 is an exploded schematic diagram illustrating a linking board displacement mechanism adapted to carry a linking board according to an embodiment of the invention. FIG. 2 is a perspective schematic diagram illustrating the linking board displacement mechanism of FIG. 1. Referring to FIG. 1 and FIG. 2, a linking board displacement mechanism 100 according to an embodiment of the invention is adapted to carry a linking board 140 and includes a base 110 and two linkage bars 120. The linking board 140 is disposed on the base 110 and includes a first connector 142.

In the present embodiment, the linking board displacement mechanism 100 is adapted to move the linking board 140 along a first axis D1. For example, the first axis D1 is a y-axis direction going upward and downward. The present embodiment further includes a second axis D2, and the second axis D2 is perpendicular to the first axis D1. For example, the second axis D2 is an x-axis direction going leftward and rightward.

In the present embodiment, the two linkage bars 120 drive the base 110 to be moved along the first axis D1. For example, the linking board 140 is a linking device electrically connected to a server, a hard drive, or an optical disc drive (e.g., an electronic device 200 of FIG. 5) and a motherboard, respectively. The linking board displacement mechanism 100 is disposed in a chassis 150 (illustrated in FIG. 5) and further includes a cover plate 130. The cover plate 130 is fixed to the chassis 150. For example, the cover plate 130 may be fixed to the chassis 150 through screws and nuts (not illustrated), adhesion, welding, or another conventional bonding method, and the invention is not specifically limited hereto.

As shown in FIG. 1, taking the linking board displacement mechanism 100 including the cover plate 130 as an example, the two linkage bars 120 of the linking board displacement mechanism 100 are connected together in a cross configuration and are hinged at the base 110. Each of the linkage bars 120 has a first end 121 and a second end 123 opposite to each other. The first end 121 of each of the linkage bars 120 is hinged at the base 110, and the second end 123 of each of the linkage bars 120 is hinged at the cover plate 130. The linking board 140 is disposed on a surface 111 of the base 110 away from the cover plate 130. However, the invention is not limited hereto. In other embodiments, it is also possible that the linking board displacement mechanism 100 does not include the cover plate 130, and the two second ends 123 of the two linkage bars 120 are respectively directly hinged at the chassis 150. In still other embodiments, the linking board 140 may also be disposed on a surface of the base 110 facing the cover plate 130.

In the present embodiment, the base 110 includes a first through-hole 112. The two first ends 121 of the two linkage bars 120 include two first elliptical slots 122 extending along the second axis D2. The two first elliptical slots 122 of the two linkage bars 120 respectively correspond to the first through-holes 112, and the corresponding first elliptical slot 122 and first through-hole 112 are partially overlapped with each other. A first post 126 passes through and hinges the corresponding first elliptical slot 122 and first through-hole 112. For example, the first post 126 is a combination of a screw and a nut, and the first post 126 movably hinges the first end 121 of each linkage bars 120 at the base 110.

More specifically, two opposite ends of the base 110 respectively include one first through-hole 112, and the two first elliptical slots 122 of the two linkage bars 120 are respectively aligned with the two first through-holes 112 such that they are partially overlapped with each other. At this time, the two first posts 126 respectively reach into the two first through-holes 112 and the two first elliptical slots 122 that are partially overlapped with each other, and the first elliptical slots 122 communicates with the first through-holes 112. Accordingly, the two first posts 126 passing through the two first through-holes 112 and the two first elliptical slots 122 may respectively move back and forth substantially along the first elliptical slot 122 on the second axis D2, but the invention is not limited hereto. In other unillustrated embodiments, the opposite two ends of the base may include two first elliptical slots, and the two linkage bars may include two first through-holes. In such unillustrated embodiments, each of the first posts may reach into the first elliptical slot and the first through-hole that are partially overlapped with each other to movably hinge each of the linkage bars at the base.

As shown in FIG. 1 and FIG. 2, in the present embodiment, the two linkage bars 120 connected together in a cross configuration include two second elliptical slots 124 that are partially overlapped with each other. A pivot 128 passes through and hinges the two second elliptical slots 124. For example, the second elliptical slot 124 is disposed between the first end 121 and the second end 123 of the linkage bar 120. Moreover, the pivot 128 is, for example, a combination of a screw and a nut. In an embodiment, the second elliptical slot 124 is, for example, located in a central portion of the linkage bar 120, but the invention is not limited hereto.

When the two linkage bars 120 are crossed, the two second elliptical slots 124 are aligned and are partially overlapped with each other. Next, the pivot 128 passes through the two second elliptical slots 124 to act as a pivot point of the two linkage bars 120 and hinge the two linkage bars 120 together. The pivot 128 may move within the two second elliptical slots 124, and the second elliptical slots 124 may rotate about the pivot 128. Accordingly, the linking board displacement mechanism 100 including the base 110, the two linkage bars 120, and the cover plate 130 may form a scissors mechanism structure such that the two linkage bars 120 drive the base 110 to be moved along the first axis D1.

In the present embodiment, the linking board displacement mechanism 100 further includes an elastic member 170. The elastic member 170 is disposed between the base 110 and the cover plate 130. Specifically, the elastic member 170 is disposed between the cover plate 130 and the linkage bars 120. Alternatively, the elastic member 170 is disposed between the base 110 and the linkage bars 120 to provide the base 110 with a force along the first axis D1. In the present embodiment, as shown in FIG. 1 and FIG. 2, a pivot point 173 of the elastic member 170 is fixed to the cover plate 130, and one end 171 of the elastic member 170 abuts against the cover plate 130, and another end 172 is connected to a fixing member 125 of the linkage bar 120. In other embodiments, the elastic member 170 may abut against the two linkage bars 120 to provide the base 110 with a force along the first axis D1. The force can maintain a distance between the base 110 and the cover plate 130, such that the base 110 is maintained at a specific position and the base 110 is prevented from being constantly displaced in a direction away from the cover plate 130 on the first axis D1 due to influence of gravity. Moreover, the elastic member 170 can also provide elasticity for the linking board displacement mechanism 100 to push or pull the base 110 back to the position before displacement. The elastic member 170 is, for example, a torsion spring, but the invention is not limited hereto.

Figure 3A:
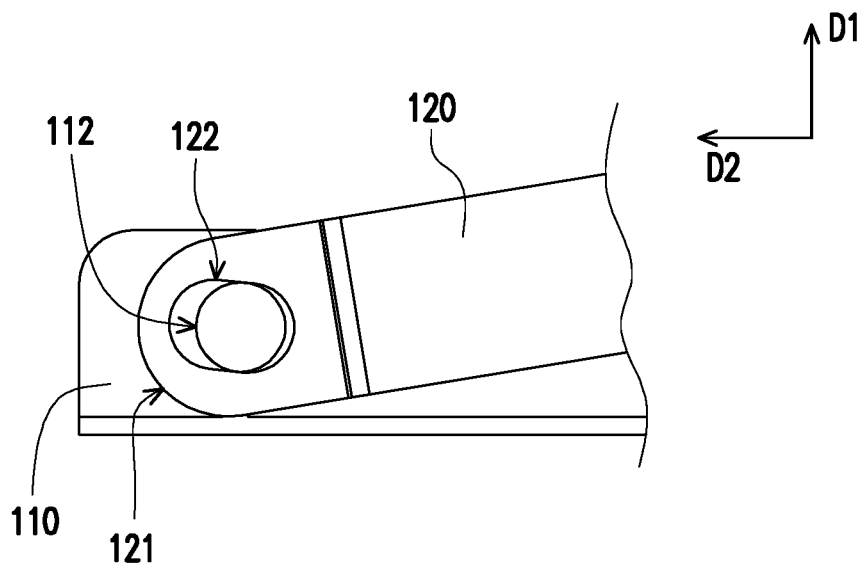
FIG. 3A is a partially enlarged side-view schematic diagram illustrating first elliptical slots of two linkage bars after a base is displaced upward according to an embodiment of the invention.
Figure 3B:
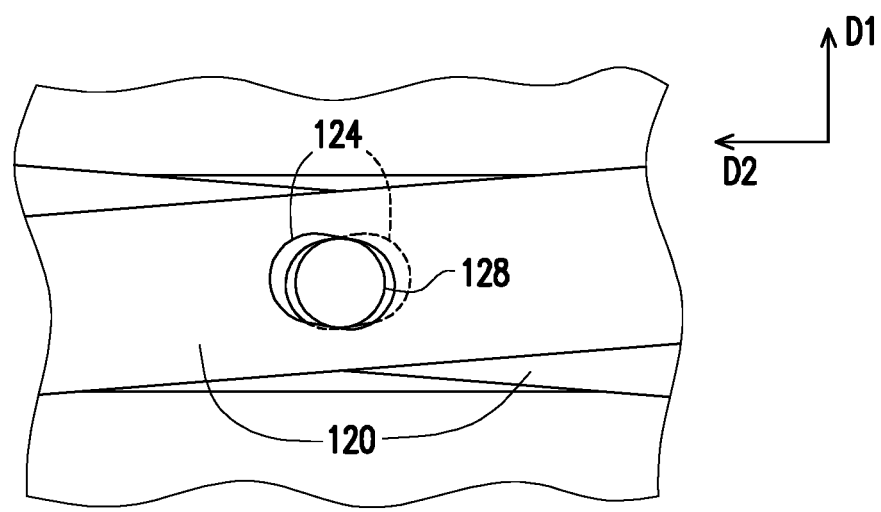
FIG. 3B is a partially enlarged side-view schematic diagram illustrating second elliptical slots of the two linkage bars after the base is displaced upward according to an embodiment of the invention.
Figure 4A:
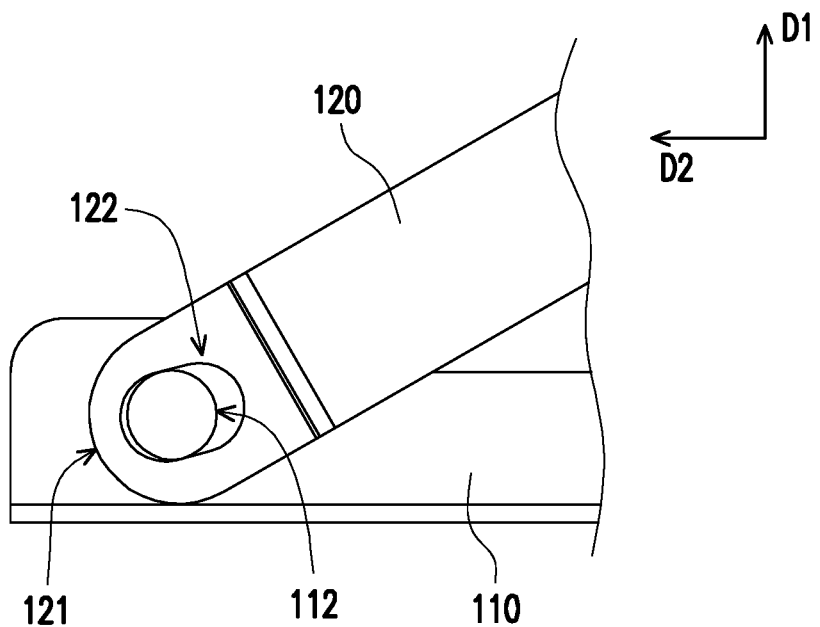
FIG. 4A is a partially enlarged side-view schematic diagram illustrating the first elliptical slots of the two linkage bars after the base is displaced downward according to an embodiment of the invention.
Figure 4B:
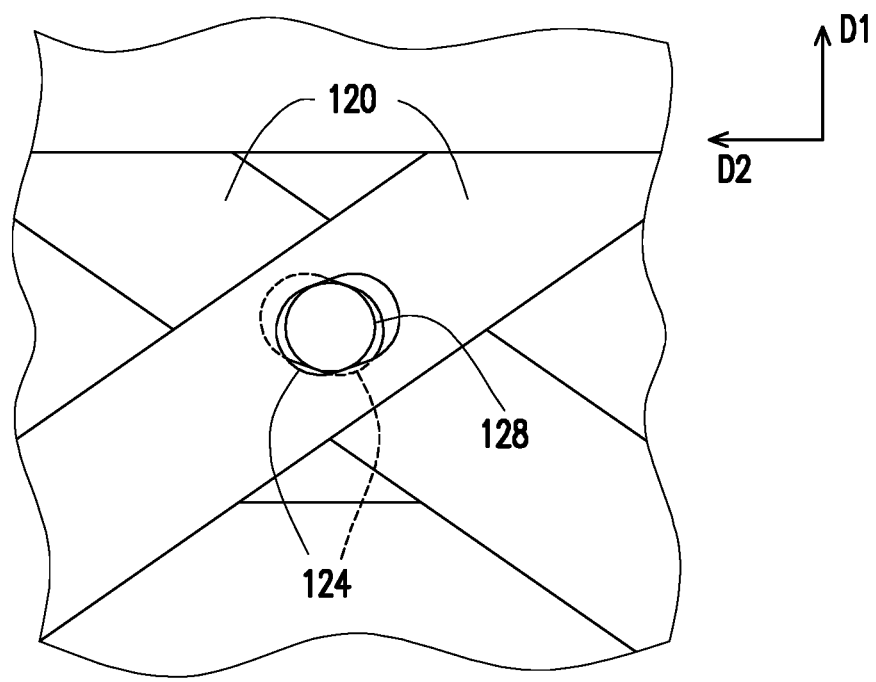
FIG. 4B is a partially enlarged side-view schematic diagram illustrating the second elliptical slots of the two linkage bars after the base is displaced downward according to an embodiment of the invention.

FIG. 3A is a partially enlarged side-view schematic diagram illustrating the first elliptical slots of the two linkage bars after the base is displaced upward according to an embodiment of the invention. FIG. 3B is a partially enlarged side-view schematic diagram illustrating the second elliptical slots of the two linkage bars after the base is displaced upward according to an embodiment of the invention. FIG. 4A is a partially enlarged side-view schematic diagram illustrating the first elliptical slots of the two linkage bars after the base is displaced downward according to an embodiment of the invention. FIG. 4B is a partially enlarged side-view schematic diagram illustrating the second elliptical slots of the two linkage bars after the base is displaced downward according to an embodiment of the invention. It is noted here that, for clarity of illustration, the first post 126 passing through the first through-hole 112 and the first elliptical slot 122 is not shown in FIG. 3A and FIG. 4A. In fact, the first posts 126 pass through and hinge the first through-holes 112 of the base 110 and the first elliptical slots 122 of the two linkage bars 120 respectively. Moreover, for clarity of illustration, FIG. 3B and FIG. 4B schematically illustrate a bolt rod of the pivot 128 and do not illustrate a bolt head (in the example where the pivot 128 is a screw), and the second elliptical slot 124 of one of the two linkage bars 120 is rendered in solid lines, and the second elliptical slot 124 of the other one of the two linkage bars 120 is rendered in broken lines. The pivot 128 passes through and hinges the two second elliptical slots 124 to act as the pivot point of the two linkage bars 120.

Referring to FIG. 1, FIG. 2, FIG. 3A, and FIG. 4A at the same time, in the example where the base 110 is displaced downward, when the linking board 140 is connected and guided by an electronic device 200 (illustrated in FIG. 5), the base 110 is moved downward along the first axis D1 following guidance of the two linkage bars 120. In other words, the two linkage bars 120 are moved from a position shown in FIG. 3A to a position shown in FIG. 4A. Specifically, the first end 121 of each of the linkage bars 120 rotates at a position hinged to the base 110, such that an included angle between the linkage bar 120 and the base 110 is increased. At this time, since the first post 126 (illustrated in FIG. 1 and FIG. 2) passes through and hinges the first through-hole 112 of the base 110, in the process where the base 110 is moved downward from a position shown in FIG. 3A to a position shown in FIG. 4A, the base 110 drives the first post 126 passing through the first through-hole 112 to move leftward in the first elliptical slot 122 from a position shown in FIG. 3A to a position shown in FIG. 4A, and meanwhile drives the two linkage bars 120 to move along as the base 110 is displaced downward.

Conversely, in the example where the base 110 is displaced upward, when the linking board 140 is connected and guided by the electronic device 200 (illustrated in FIG. 5), the base 110 is moved upward along the first axis D1 following guidance of the two linkage bars 120. In other words, the two linkage bars 120 are moved from the position shown in FIG. 4A to the position shown in FIG. 3A. Specifically, the first end 121 of each of the linkage bars 120 rotates at a position hinged to the base 110, such that the included angle between the linkage bar 120 and the base 110 is decreased. At this time, since the first post 126 (illustrated in FIG. 1 and FIG. 2) passes through and hinges the first through-hole 112 of the base 110, in the process where the base 110 is moved upward from the position shown in FIG. 4A to the position shown in FIG. 3A, the base 110 drives the first post 126 passing through the first through-hole 112 to move rightward in the first elliptical slot 122 from the position shown in FIG. 4A to the position shown in FIG. 3A, and meanwhile drives the two linkage bars 120 to move along as the base 110 is displaced upward.

Referring to FIG. 1, FIG. 2, FIG. 3B, and FIG. 4B at the same time, in the example where the base 110 is displaced downward, the two linkage bars 120 are moved from a position shown in FIG. 3B to a position shown in FIG. 4B. In other words, the two second elliptical slots 124 of the two linkage bars 120 are rotated on the pivot 128. For example, the second elliptical slot 124 of one (rendered in solid lines) of the two linkage bars 120 is rotated counterclockwise from a position shown in FIG. 3B to a position shown in FIG. 4B. The second elliptical slot 124 of the other one (rendered in broken lines) of the two linkage bars 120 is rotated clockwise from a position shown in FIG. 3B to a position shown in FIG. 4B, but the invention is not limited hereto. Accordingly, in the process where the base 110 is moved downward from a position shown in FIG. 3B to a position shown in FIG. 4B, on the first axis D1, an included angle between the two linkage bars 120 is increased, and the distance between the cover plate 130 and the base 110 is thus increased.

Conversely, in the example where the base 110 is displaced upward, the two linkage bars 120 are moved from the position shown in FIG. 4B to the position shown in FIG. 3B. In other words, the two second elliptical slots 124 of the two linkage bars 120 are rotated on the pivot 128. For example, the second elliptical slot 124 of one (rendered in solid lines) of the two linkage bars 120 is rotated clockwise from the position shown in FIG. 4B to the position shown in FIG. 3B.

The second elliptical slot 124 of the other one (rendered in broken lines) of the two linkage bars 120 is rotated counterclockwise from the position shown in FIG. 4B to the position shown in FIG. 3B, but the invention is not limited hereto. Accordingly, in the process where the base 110 is moved upward from the position shown in FIG. 4B to the position shown in FIG. 3B, on the first axis D1, the included angle between the two linkage bars 120 is decreased, and the distance between the cover plate 130 and the base 110 is thus decreased.

Figure 5:
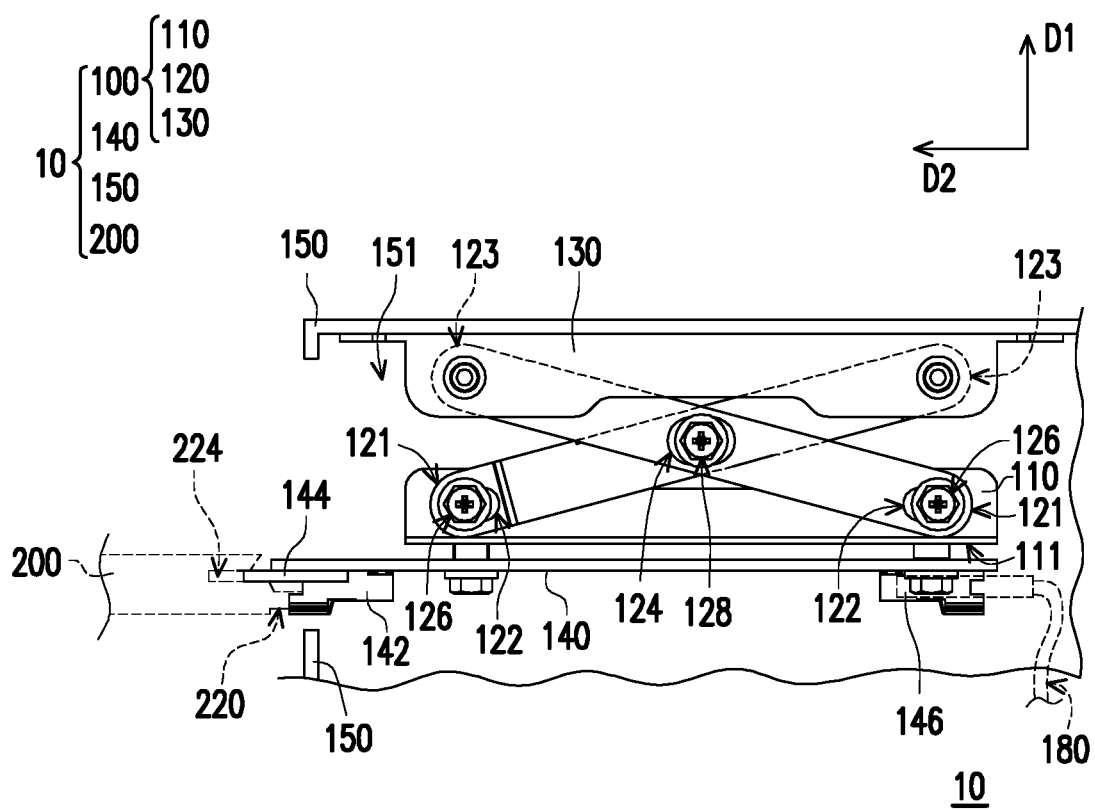
FIG. 5 is a side-view schematic diagram illustrating an electronic apparatus according to an embodiment of the invention.

FIG. 5 is a side-view schematic diagram illustrating an electronic apparatus according to an embodiment of the invention. Referring to FIG. 2 and FIG. 5, in the present embodiment, an electronic apparatus 10 is adapted to be joined with an electronic device 200 (rendered in broken lines in FIG. 5). The electronic apparatus 10 includes the chassis 150 and the linking board displacement mechanism 100. Taking the linking board displacement mechanism 100 including the cover plate 130 as an example, the linking board displacement mechanism 100 may be fixed to the chassis 150 through the cover plate 130. For example, the linking board 140 further includes a third connector 146. The first connector 142 is exposed out of the chassis 150 and is oriented toward outside of the chassis 150. The third connector 146 is oriented toward an internal space 151 within the chassis 150 and is located in the chassis 150. The third connector 146 is joined with a transmission line 180 located in the chassis 150 to be electrically connected to a motherboard (not illustrated) of the electronic apparatus 10 or other electronic components, but the invention is not limited hereto. The first connector 142 may be aligned and joined with a second connector 220 of the electronic device 200. Accordingly, the electronic apparatus 10 may be joined with the electronic device 200 via the linking board 140 to achieve electrical connection.

In the present embodiment, one of the linking board 140 and the electronic device 200 may optionally include a guiding slot 224 extending along the second axis D2, and the other one may include a guiding protrusion 144 extending along the second axis D2. In the process of joining the second connector 220 of the electronic device 200 with the first connector 142 of the linking board 140 along the second axis D2, the guiding protrusion 144 reaches into the guiding slot 224 to drive the base 110 connected with the linking board 140 to be moved along the first axis D1. The invention is not limited hereto. In other embodiments, it is possible that one of the linking board 140 and the electronic device 200 does not include the guiding protrusion 144, and the other one does not include the guiding slot 224.

Specifically, as shown in FIG. 2 and FIG. 5, the linking board 140 includes the guiding protrusion 144, and the guiding protrusion 144 protrudes from the linking board 140 farther than the first connector 142. Taking the linking board 140 including the guiding protrusion 144 as an example, the guiding protrusion 144 is, for example, disposed on the linking board 140, is disposed at two sides of the first connector 142, and extends toward outside of the chassis 150 along the second axis D2, but the invention is not limited hereto. In other embodiments, the guiding protrusion 144 may also be formed in the first connector 142. In the present embodiment, the guiding slot 224 is disposed on the electronic device 200 to correspond to the guiding protrusion 144, but the invention is not limited hereto. In other embodiments, the guiding slot 224 may also be configured in the second connector 220. Moreover, in other embodiments, the guiding protrusion 144 may also be disposed on the electronic apparatus 200 or disposed in the second connector 220, and the guiding slot 224 corresponding to the guiding protrusion 144 may also be disposed on the linking board 140 or disposed in the first connector 142.

It is noted that, when the second connector 220 of the electronic device 200 is not aligned with the first connector 142 of the linking board 140 due to alignment tolerance (for example, the second connector 220 is located above or below the first connector 142 on the first axis D1) and when the second connector 220 is moved along the second axis D2 to be joined with the first connector 142, the guiding protrusion 144 reaches into the guiding slot 224 first. Since the guiding protrusion 144 reaches into the guiding slot 224, the linking board 140 and the base 110 are driven to be moved in a direction away from the cover plate 130 or close to the cover plate 130 along the first axis D1. Accordingly, the first connector 142 of the linking board 140 corresponds to the second connector 220 of the electronic device 200 and is slightly displaced on the first axis D1 (for example, moving downward or upward). Therefore, the first connector 142 of the linking board 140 and the second connector 220 of the electronic device 200 are gradually aligned with each other on the first axis D1 in the joining process. In the foregoing configuration, the alignment between the first connector 142 of the linking board 140 and the second connector 220 of the electronic device 200 on the first axis D1 may be further guided through the guiding protrusion 144 and the corresponding guiding slot 224. Therefore, the linking board displacement mechanism 100 can compensate for the tolerance between the second connector 220 of the electronic device 200 and the first connector 142 of the linking board 140 on the first axis D1 and mitigate issues of loose contact between the first connector 142 and the second connector 220 and damage to the connectors resulting from bump in the joining process.

However, the invention is not limited hereto. In other embodiments, it is also possible that the linking board 140 does not include the guiding protrusion 144, and the electronic device 200 does not include the guiding slot 224. In such embodiments, for example, through coordination of a contour (e.g., an internal contour) of the first connector 142 and a contour (e.g., an external contour) of the second connector 220 between the linking board 140 and the electronic device 200, in the process where the second connector 220 of the electronic device 200 is moved toward and joined with the first connector 142 of the linking board 140 along the second axis D2, the first connector 142 of the linking board 140 is slightly displaced (for example, moving downward or upward) along the contour of the second connector 220 of the electronic device 200 on the first axis D1. Accordingly, the first connector 142 of the linking board 140 and the second connector 220 of the electronic device 200 are gradually aligned with each other on the first axis D1 in the joining process.

Moreover, the linking board 140 is fixed on the base 110 such that the linking board 140 can move by translation along the first axis D1, which prevents the linking board 140 from skewing and being non-parallel to the second axis D2 due to a weight of the transmission line 180 or stress/strain and further reduces undesirable non-parallel joining between the first connector 142 and the second connector 220. Accordingly, a possibility of damage resulting from bump when the second connector 220 and the first connector 142 are joined together may be reduced, and the issue of loose contact between the electronic device 200 and the linking board 140 may be solved.

Moreover, since the electronic apparatus 10 includes the linking board displacement mechanism 100 described above, it can provide excellent contact between the electronic device 200 and the linking board 140 in the chassis 150 and thereby enhance performance of the electronic apparatus 10. The electronic apparatus 10 may further reduce undesirable non-parallel joining between the first connector 142 of the linking board 140 and the second connector 220 of the electronic device 200 and thereby reduce damage to the first connector 142 of the linking board 140 and the second connector 220 of the electronic device 200.

It should be noted here that the reference numerals and a part of the contents in the previous embodiments are used in the following embodiments, in which identical reference numerals represent identical or similar components, and reference may be made to the previous embodiments for part of the omitted descriptions of the identical technical content, which shall not be repeated in the following embodiments.

Figure 6:
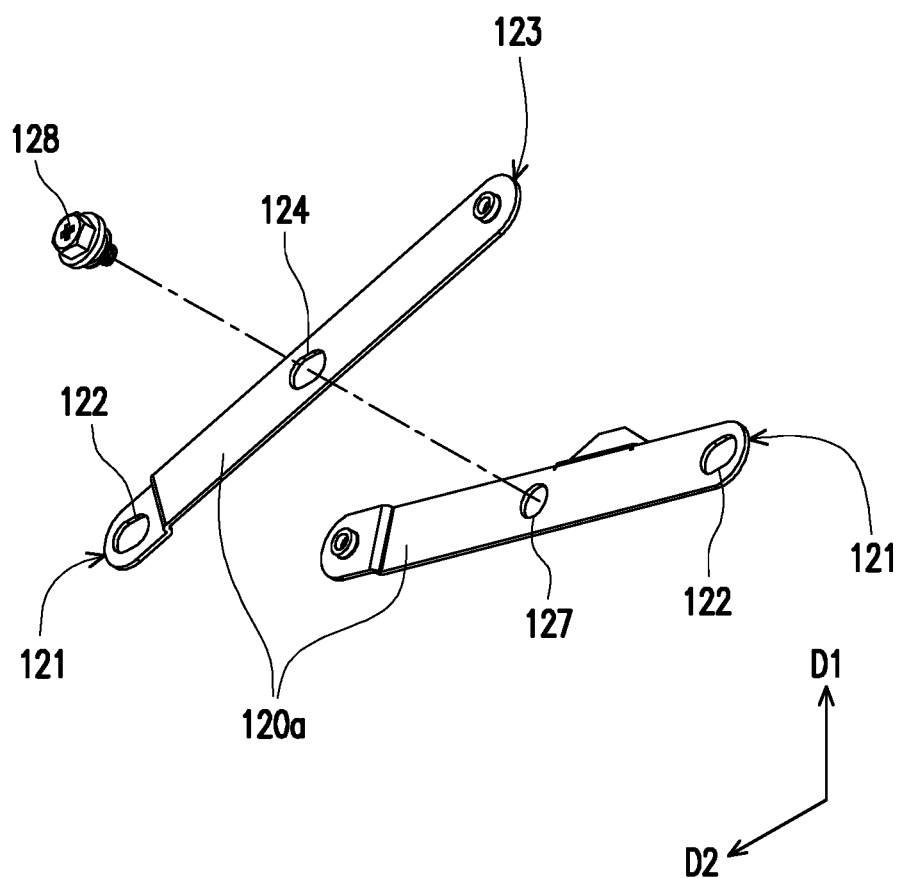
FIG. 6 is an exploded schematic diagram illustrating two linkage bars of a linking board displacement mechanism according to another embodiment of the invention.

FIG. 6 is an exploded schematic diagram illustrating two linkage bars of a linking board displacement mechanism according to another embodiment of the invention. Referring to FIG. 1 and FIG. 6, two linkage bars 120a of the present embodiment are similar to the two linkage bars 120 of FIG. 1, and the main difference lies in that one of the two linkage bars 120a includes a second elliptical slot 124, and the other one includes a second through-hole 127. The second elliptical slot 124 and the second through-hole 127 are partially overlapped with each other, and the pivot 128 passes through and hinges the second elliptical slot 124 and the second through-hole 127. Specifically, the second elliptical slot 124 of one of the two linkage bars 120a and the second through-hole 127 of the other one of the two linkage bars 120a may be aligned and partially overlapped with each other. Next, the pivot 128 passes through the second elliptical slot 124 and the second through-hole 127 to hinge the two linkage bars 120a together. Therefore, the two linkage bars 120a may form a scissors mechanism structure, and the pivot 128 may move back and forth within the second elliptical slot 124. Accordingly, the two linkage bars 120a can drive the base 110 to be moved along the first axis D1.

Figure 7:
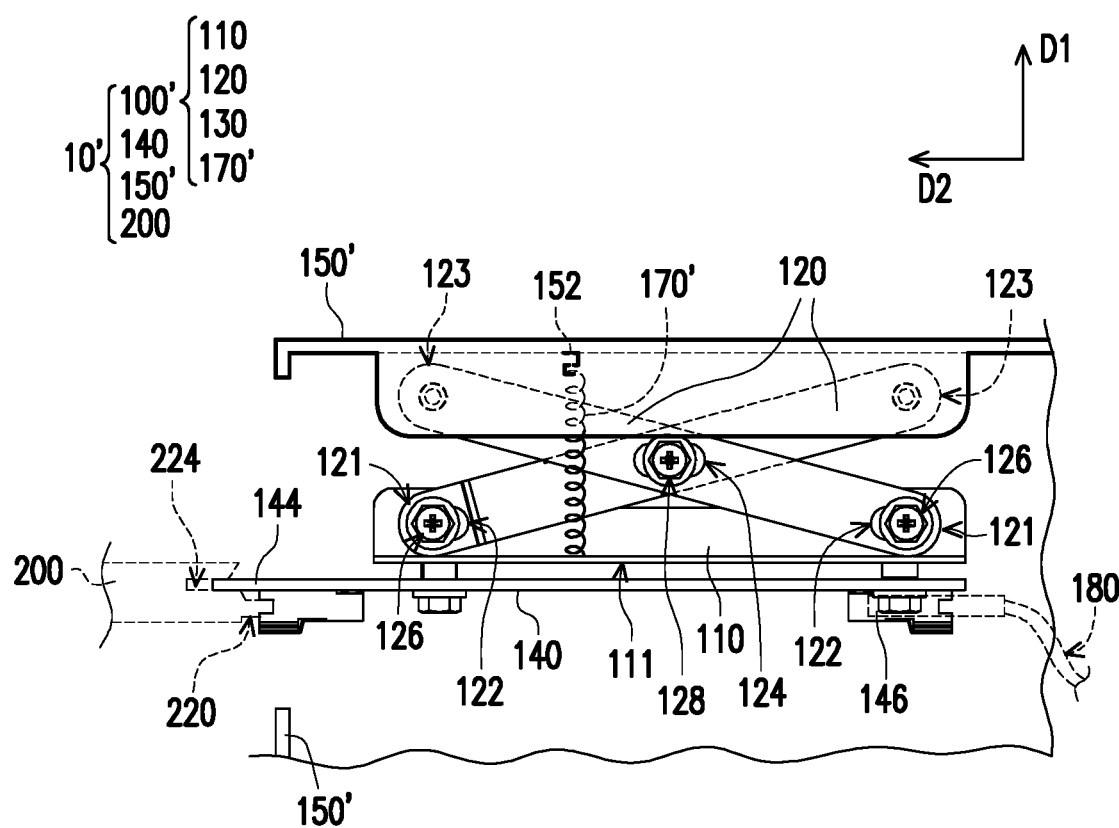
FIG. 7 is a side-view schematic diagram illustrating an electronic apparatus according to another embodiment of the invention.

FIG. 7 is a side-view schematic diagram illustrating an electronic apparatus according to another embodiment of the invention. Referring to FIG. 5 and FIG. 7, an electronic apparatus 10' of the present embodiment is similar to the electronic apparatus 10 of FIG. 5, and the main difference lies in that the two second ends 123 of the two linkage bars 120 are respectively hinged on a chassis 150', and an elastic member 170' is disposed between the base 110 and the chassis 150'. Specifically, taking a linking board displacement mechanism 100' not including the cover plate 130 as an example, the two second ends 123 of the two linkage bars 120 are respectively directly hinged on the chassis 150' in a rotatable manner. The elastic member 170' is, for example, a spring, and one end of the elastic member 170' is fixed on the base 110, and the other end is fixed on a fixing member 152 located on the chassis 150'. The fixing member 152 is located between the base 110 and the chassis 150', is away from the base 110, and is close to a portion of the chassis 150' above on the first axis D1. In such configuration, the elastic member 170' can maintain a distance between the base 110 and the chassis 150'. Accordingly, the linking board displacement mechanism 100' can achieve technical effect identical to that in the foregoing embodiments.

In summary of the above, the electronic apparatus of the embodiments of the invention is adapted to be joined with an electronic device, and the electronic apparatus includes the linking board displacement mechanism. The linking board displacement mechanism includes the two linkage bars connected together in a cross configuration. The first ends of the linkage bars are hinged at the base, and the second ends are rotatably connected to the chassis. Moreover, the linking board displacement mechanism and the electronic device respectively include the corresponding guiding protrusion and guiding slot. In such configuration, when the linking board is fixed to the base and an alignment tolerance is present between the second connector of the electronic device and the first connector of the linking board on the first axis, in the process where the second connector of the electronic device and the first connector of the linking board are joined together, the base of the linking board displacement mechanism is guided to be moved along the first axis. By fine-tuning the alignment tolerance between the second connector and the first connector on the first axis, the first connector can be aligned with the second connector. Accordingly, the second connector can be aligned with the first connector to compensate for the alignment tolerance between the first connector and the second connector. Moreover, the linking board is fixed on the base to be moved by translation along the first axis. Therefore, a non-parallel configuration of the linking board can be prevented, and undesirable non-parallel joining between the first connector and the second connector can be reduced. The possibility of damage resulting from bump when the second connector and the first connector are joined together can be further reduced, and the issue of loose contact between the electronic device and the linking board can be solved. Moreover, the linking board displacement mechanism provides excellent contact between the electronic device and the linking board in the chassis and thereby enhances performance of the electronic apparatus. Damage to the linking board and the electronic device resulting from undesirable joining can be further reduced. In addition, the linking board displacement mechanism further includes the elastic member to elastically maintain the base at a specific position.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic apparatus adapted to be joined with an electronic device, the electronic apparatus comprising:
    a linking board, comprising a first connector adapted to be connected to the electronic device; and
    a linking board displacement mechanism, disposed in the chassis and adapted to carry the linking board, the linking board displacement mechanism comprising:
        a base, wherein the linking board is disposed on the base; and
        two linkage bars, connected together in a cross configuration and respectively hinged at the base, wherein the linkage bars drive the base to be moved along a first axis such that the first connector of the linking board is aligned with a second connector of the electronic device on the first axis;
    wherein the linking board and the electronic device respectively comprise a guiding slot and a guiding protrusion, the guiding slot and the guiding protrusion extend longitudinally along a second axis, when the second connector of the electronic device and the first connector of the linking board are joined together, the guiding protrusion reaches into the guiding slot to drive the base moving along the first axis, and the second axis is perpendicular to the first axis.

2. The electronic apparatus according to claim 1, wherein each of the linkage bars has a first end and a second end opposite to each other, the first ends are respectively hinged at the base, and the second ends are respectively hinged at the chassis.

3. The electronic apparatus according to claim 1, wherein the linking board displacement mechanism further comprises a cover plate disposed on the chassis, each of the linkage bars has a first end and a second end opposite to each other, the first ends are respectively hinged at the base, the second ends are respectively hinged at the cover plate, and the linking board is disposed on a surface of the base away from the cover plate.

4. The electronic apparatus according to claim 3, wherein the linking board displacement mechanism further comprises an elastic member disposed between the cover plate and the linkage bars.

5. The electronic apparatus according to claim 1, wherein the linking board displacement mechanism further comprises a first post, each of the linkage bars has a first end hinged at the base, the first ends of the linkage bars and the base correspondingly form a first through-hole and a first elliptical slot respectively, the first elliptical slots and the first through-holes are partially overlapped with each other, and the first post passes through and hinges the first elliptical slot and the first through-hole.

6. The electronic apparatus according to claim 5, wherein the linking board displacement mechanism further comprises a pivot, each of the linkage bars forms a second elliptical slot, and the pivot passes through and hinges the second elliptical slots.

7. The electronic apparatus according to claim 5, wherein the linking board displacement mechanism further comprises a pivot, the linkage bars respectively form a second elliptical slot and a second through-hole, the second elliptical slot and the second through-hole are partially overlapped with each other, and the pivot passes through and hinges the second elliptical slot and the second through-hole.

8. The electronic apparatus according to claim 1, wherein the linking board displacement mechanism further comprises an elastic member disposed between the base and the chassis.

* * * * *